(12) United States Patent
Matsunami et al.

(10) Patent No.: US 9,871,179 B2
(45) Date of Patent: Jan. 16, 2018

(54) THERMOELECTRIC POWER MODULE (71) Applicant: KELK LTD., Kanagawa (JP)

(72) Inventors: Hiroyuki Matsunami, Kanagawa (JP); Shinichi Fujimoto, Kanagawa (JP)

(73) Assignee: KELK LTD., Kanagawa (JP)

(*) Notice: Subject to any disclaimer, the term of this patent is extended or adjusted under 35 U.S.C. 154(b) by 85 days.

(21) Appl. No.: 14/902,867

(22) PCT Filed: Jul. 2, 2014

(86) PCT No.: PCT/JP2014/068241
§ 371 (c)(1),
(2) Date: Jan. 5, 2016

(87) PCT Pub. No.: WO2015/005362
PCT Pub. Date: Jan. 15, 2015

(65) Prior Publication Data
US 2016/0141479 A1 May 19, 2016

(30) Foreign Application Priority Data

Jul. 9, 2013 (JP) ................................. 2013-143372

(51) Int. Cl.
*H01L 31/08* (2006.01)
*H01L 35/10* (2006.01)
(Continued)

(52) U.S. Cl.
CPC .............. *H01L 35/08* (2013.01); *H01L 35/10* (2013.01); *H01L 35/16* (2013.01); *H01L 35/18* (2013.01); *H01L 35/32* (2013.01); *H01L 35/34* (2013.01)

(58) Field of Classification Search
CPC ......... H01L 35/08; H01L 35/10; H01L 35/16; H01L 35/18; H01L 35/32
(Continued)

(56) References Cited

U.S. PATENT DOCUMENTS 3,580,743 A * 5/1971 MacPhee et al. ....... H01L 35/08
136/212
4,489,742 A * 12/1984 Moore .................... H01L 35/08
136/201
(Continued)

FOREIGN PATENT DOCUMENTS

JP 2004-228293 8/2004
JP 2004-349651 12/2004
(Continued)

OTHER PUBLICATIONS

International Search Report dated Oct. 14, 2014 in International Application No. PCT/JP2014/068241.

*Primary Examiner* — Lindsey Bernier
(74) *Attorney, Agent, or Firm* — Wenderoth, Lind & Ponack, L.L.P.

(57) ABSTRACT

A thermoelectric power module comprising: a thermoelectric element employing a bismuth-tellurium (Bi—Te) based thermoelectric material; at least one barrier layer disposed on the thermoelectric element; an electrode; an electrode protection layer disposed at least on one principal surface of the electrode; a solder layer having a side surface formed with a recess, the solder layer joining a first region of the electrode protection layer to the at least one barrier layer; and a coating film disposed on a side surface of the thermoelectric element, a side surface of the at least one barrier layer, and the side surface of the solder layer, the coating film covering a second region adjacent to the first region of the electrode protection layer and being filled into the recess of the solder layer.

11 Claims, 8 Drawing Sheets

(51) Int. Cl.
    *H01L 35/16*     (2006.01)
    *H01L 35/18*     (2006.01)
    *H01L 35/32*     (2006.01)
    *H01L 35/08*     (2006.01)
    *H01L 35/34*     (2006.01)

(58) Field of Classification Search
    USPC .............................. 136/236.1, 237, 238, 240
    See application file for complete search history.

(56) References Cited

U.S. PATENT DOCUMENTS

| | | |
|---|---|---|
| 2005/0241690 A1 | 11/2005 | Tajima et al. |
| 2006/0180191 A1* | 8/2006 | Yasutake ................. H01L 35/08 136/211 |
| 2013/0014796 A1* | 1/2013 | Tajima .................... H01L 35/08 136/203 |
| 2013/0032188 A1* | 2/2013 | Kajihara ................. H01L 35/08 136/200 |

FOREIGN PATENT DOCUMENTS

| | | | |
|---|---|---|---|
| JP | 2005-136075 | 5/2005 | |
| JP | 2011-171668 | 9/2011 | |
| JP | 2012-231025 | 11/2012 | |
| WO | WO 2011102498 A2 * | 8/2011 | ............. H01L 35/08 |

\* cited by examiner

THERMOELECTRIC POWER MODULE

TECHNICAL FIELD

The present invention relates to a thermoelectric power module using thermoelectric elements and thereby generating electricity by utilizing difference in temperature.

BACKGROUND ART

Conventionally, thermoelectric generation of electricity is known in which the thermoelectric elements are disposed between a heat exchanger at a higher temperature part and another heat exchanger at a lower temperature part to generate electricity. The thermoelectric element is an application of a thermoelectric effect to be called Seebeck effect. In the case where a semiconductor material is used as a thermoelectric material, the thermoelectric power module is configured by electrically connecting a thermoelectric element formed of a P-type semiconductor thermoelectric material and another thermoelectric element formed of an N-type semiconductor thermoelectric material via an electrode.

Such a thermoelectric power module has a simple structure and can be easily treated, and stable characteristics can be retained. Therefore, research work thereof has been widely progressed toward application for the thermoelectric generation of electricity in which electricity is generated by utilizing heat in a gas discharged from an engine of a car, a furnace of a factory, and so on.

Generally, the thermoelectric power module is used in a temperature environment where a difference between a temperature (Th) at a higher temperature part and a temperature (Tc) at a lower temperature part becomes large in order to obtain high thermoelectric conversion efficiency. For example, a thermoelectric power module employing a typical bismuth-tellurium (Bi—Te) based thermoelectric material is used in a temperature environment where a temperature (Th) at the higher temperature part becomes 250° C. to 280° C. at maximum. Accordingly, deterioration of a joint layer for joining the thermoelectric element to the electrode becomes a problem.

As a related art, Japanese patent application publication JP-P2012-231025A, especially, paragraphs 0017-0018 discloses a thermoelectric module in which oxidation is prevented from generating at a joint boundary of the thermoelectric module and loss of output power is small. The thermoelectric module consists of thermoelectric elements formed of a metal oxide and for converting difference in temperature into electric power, electrode members for extracting the electric power converted by the thermoelectric elements, and conductive joint layers for joining the thermoelectric elements to the electrode members, and is characterized in that the joint layers have oxygen infiltration preventing means for preventing oxygen from infiltrating into the joint layer.

It is effective to prevent oxygen from infiltrating into the joint layer in order to prevent deterioration of the joint layer. However, according to FIG. 1 of JP-P2012-231025A, only infiltration of oxygen into a joint boundary between the conductive joint layer and the thermoelectric element is prevented by a film, and therefore, deterioration of the conductive joint layer itself cannot be avoided. Further, there are other factors, which deteriorate the thermoelectric power device, such as a short circuit due to extraneous materials, dew condensation, and so on, and therefore, it is insufficient to provide the oxygen infiltration preventing means for preventing oxygen from infiltrating into the joint layer. Furthermore, the temperature range in which the thermoelectric element formed of a metal oxide displays its ability is a temperature range equal to or higher than 500° C. which is different from a usual temperature range for the thermoelectric generation of electricity. Accordingly, an application range of the thermoelectric power device is narrowed.

Further, Japanese patent application publication JP-P2004-228293A, especially, paragraphs 0007-0009 discloses a thermoelectric module provided with an oxidation preventing film which enables use of a thermoelectric element even in high temperature applications such as a car. The thermoelectric module is characterized in that a thermoelectric material of the thermoelectric module is coated with an inorganic and organic highbred material.

However, a main factor, which deteriorates performance of the thermoelectric power module, is deterioration of a joint layer for joining a thermoelectric element to an electrode, and therefore, it is insufficient to only coat the thermoelectric material. Further, since no measure is taken to prevent the oxidation preventing film from peeling off, there is a possibility that the oxidation preventing film may peel off the thermoelectric material to lose the oxidation preventing function. On the other hand, if the oxidation preventing film is made thick, heat-leakage between the heat exchanger at the higher temperature part and the heat exchanger at the lower temperature part will increase.

SUMMARY OF INVENTION

Technical Problem

Accordingly, in view of the above-mentioned points, an object of the present invention is to provide a thermoelectric power module capable of suppressing increase of heat-leakage between a heat exchanger at a higher temperature part and another heat exchanger at a lower temperature part while effectively preventing oxidation of a thermoelectric element, an electrode, and a joint layer for joining the thermoelectric element to the electrode, and preventing a short circuit due to extraneous materials, dew condensation, and so on.

Solution to Problem

In order to achieve the above-mentioned object, a thermoelectric power module according to one aspect of the present invention includes: a thermoelectric element employing a bismuth-tellurium (Bi—Te) based thermoelectric material; at least one barrier layer disposed on the thermoelectric element; an electrode; an electrode protection layer disposed at least on one principal surface of the electrode; a solder layer having a side surface formed with a recess, the solder layer joining a first region of the electrode protection layer to the at least one barrier layer; and a coating film disposed on a side surface of the thermoelectric element, a side surface of the at least one barrier layer, and the side surface of the solder layer, the coating film covering a second region adjacent to the first region of the electrode protection layer and being filled into the recess of the solder layer.

Advantageous Effects of Invention

According to one aspect of the present invention, by providing the coating film which is disposed on the side surface of the thermoelectric element, the side surface of the at least one barrier layer, and the side surface of the solder layer, and which covers the second region adjacent to the first region of the electrode protection layer and is filled into the recess of the solder layer, it is possible to effectively prevent oxidation of the thermoelectric element, the electrode, and the joint layer (the barrier layer to the electrode protection layer) for joining the thermoelectric element to the electrode. Further, since the coating film is continuously provided from the thermoelectric element to the electrode, it is possible to prevent deterioration factors besides the oxidation of the thermoelectric element, the electrode, and the joint layer, for example, a short circuit due to extraneous materials, dew condensation, and so on, to ensure reliability of the thermoelectric power module for a long time. Furthermore, since the coating film is filled into the recess of the solder layer, an area to be contact with the solder layer is increased 1.3 times to 1.6 times in comparison with the case where the recess is not formed, and therefore, peeling off of the coating film hardly occurs. On the other hand, since a film thickness of the coating film is thin at the side surface of the thermoelectric element, it is possible to suppress increase of heat-leakage between the heat exchanger at the higher temperature part and the heat exchanger at the lower temperature part.

DESCRIPTION OF EMBODIMENTS

Hereinafter, an embodiment of the present invention will be explained in detail by referring to the drawings. The same reference characters are assigned to the same component elements, and overlapping description thereof will be omitted.

Figure 1:
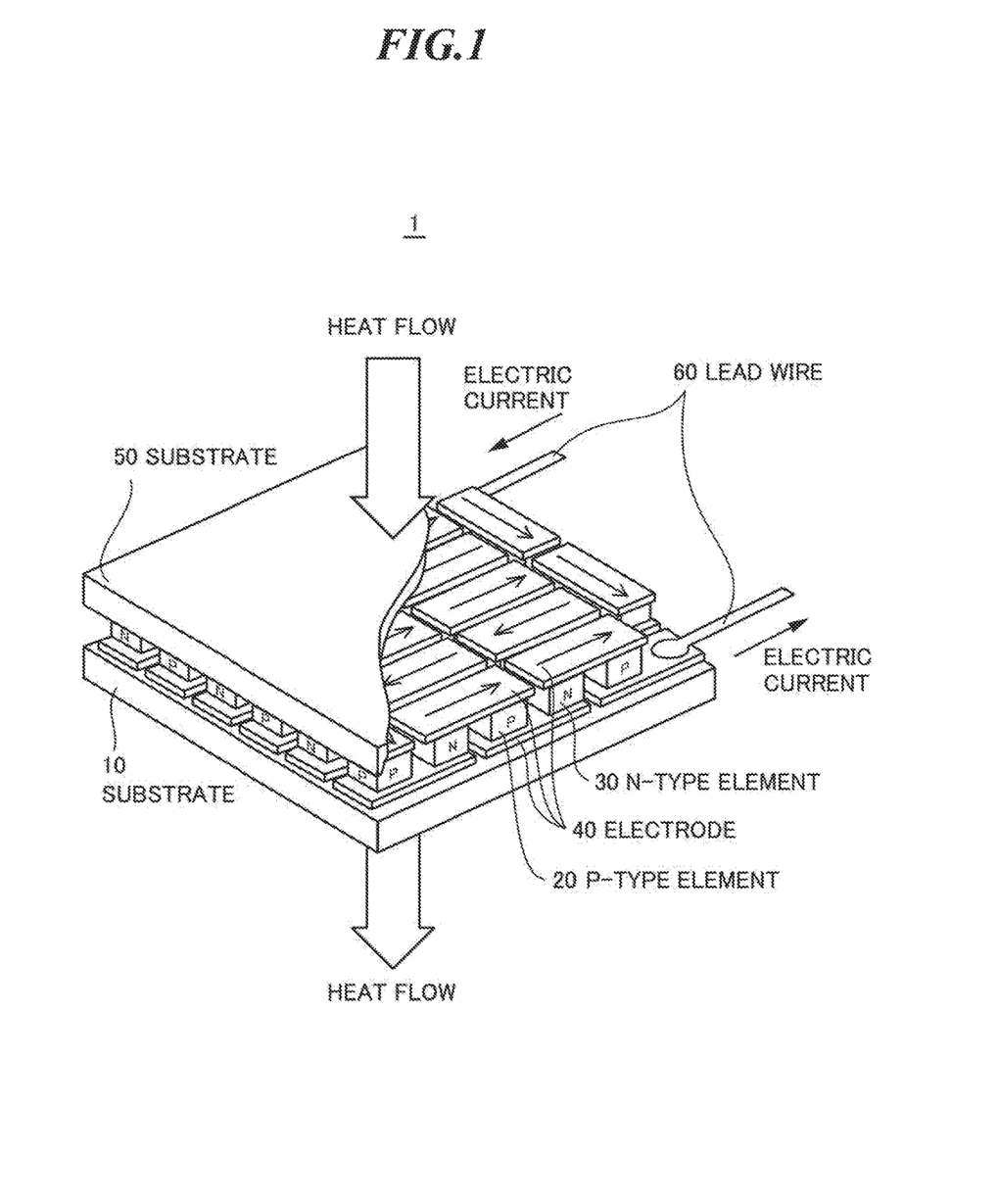
FIG. 1 is a perspective diagram showing an outline of a thermoelectric power module according to an embodiment of the present invention.

FIG. 1 is a perspective diagram showing an outline of a thermoelectric power module according to an embodiment of the present invention. In the thermoelectric power module 1, a thermoelectric element (P-type element) 20 formed of a P-type semiconductor thermoelectric material and a thermoelectric element (N-type element) 30 formed of an N-type semiconductor thermoelectric material are electrically connected via an electrode 40, and thereby, a PN element pair is configured. Further, plural PN element pairs are connected in series via electrodes 40. In FIG. 1, substrates (heat exchange substrates) 10 and 50 formed of an electric insulation material such as ceramics are arranged to hold those PN element pairs therebetween.

Two lead wires 60 are electrically connected via electrodes to the P-type element at one end and the N-type element at the other end of a series circuit composed of the plural PN element pairs, respectively. When cooling the substrate 10 part by coolant or the like and supplying heat to the substrate 50 part, electromotive force is generated in the thermoelectric power module. When a load (not shown) is connected between the lead wires 60, an electric current flows as shown in FIG. 1. That is, by supplying difference in temperature between both parts of the thermoelectric power module 1 (an upper part and a lower part in the drawing), electric power can be extracted.

For example, a size (length, width, and height) of the substrates 10 and 50 is 45 mm×45 mm×0.5 mm, and a distance from a bottom surface of the lower substrate 10 to a top surface of the upper substrate 50 in the drawing is 4.3 mm.

Here, it is desirable that either one or both of the substrates 10 and 50 are omitted such that the electrodes may be in directly contact with a surface of heat exchanger having an electrical insulating property. In that case, the thermoelectric conversion efficiency can be improved. The thermoelectric power module, in which either one of the substrates 10 and 50 is omitted, is called half-skeleton structure, and the thermoelectric power module, in which both of the substrates 10 and 50 are omitted, is called full-skeleton structure.

Each of the P-type element 20 and the N-type element 30 is composed of a bismuth-tellurium (Bi—Te) based thermoelectric material. For example, the P-type element 20 is composed of a thermoelectric material containing bismuth (Bi), tellurium (Te), and antimony (Sb). Further, the N-type element 30 is composed of a thermoelectric material containing bismuth (Bi), tellurium (Te), and selenium (Se). Especially, in a temperature environment where a temperature of a heat exchanger at a higher temperature part becomes 250° C. to 280° C. at maximum, the bismuth-tellurium (Bi—Te) based thermoelectric material is suitable.

Figure 2:
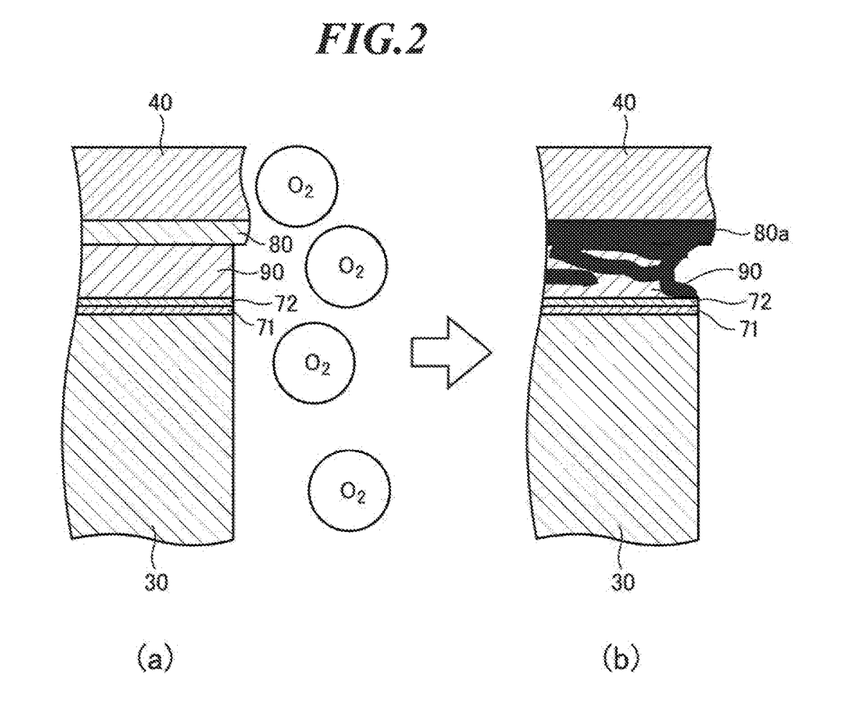
FIG. 2 is an enlarged cross section diagram showing a part of a thermoelectric power module according to a comparative example.

FIG. 2 is an enlarged cross section diagram showing a part of a thermoelectric power module according to a comparative example. FIG. 2(a) shows an initial state of the thermoelectric power module, and FIG. 2(b) conceptionally shows a state of the thermoelectric power module after being left in a high temperature environment for a long time.

Referring to FIG. 2(a), in this thermoelectric power module, a barrier layer 71 of molybdenum (Mo) is disposed on the thermoelectric element (N-type element 30), and a barrier layer 72 consisting of an alloy or intermatallic compound of nickel-tin (Ni—Sn) is disposed on the barrier layer 71. On the other hand, an electrode protection layer 80 is disposed on at least one principal surface (bottom surface in the drawing) of an electrode 40 formed of copper (Cu), mainly in order to prevent oxidation of the electrode 40 and improve reactivity with solder. The electrode protection layer 80 includes at least one metal layer. For example, the electrode protection layer 80 includes at least one of nickel (Ni), layered structure of gold/nickel (Au/Ni), tin (Sn), an alloy or intermetallic compound containing nickel (Ni), and combined structure of at least two thereof. Further, the barrier layer 72 and the electrode protection layer 80 are joined to face each other by a solder layer 90 containing lead (Pb) at 85% or more.

However, when the thermoelectric power module according to the comparative example is left in a high temperature environment for a long time, nickel contained in the electrode protection layer 80 diffuses into the solder layer 90 as shown in FIG. 2(b). When the nickel diffusing into the solder layer 90 is oxidized to form nickel oxide 80a, there occurs a problem that the electric resistance of the solder layer 90 increases and output power of the thermoelectric power module lowers.

Figure 3:
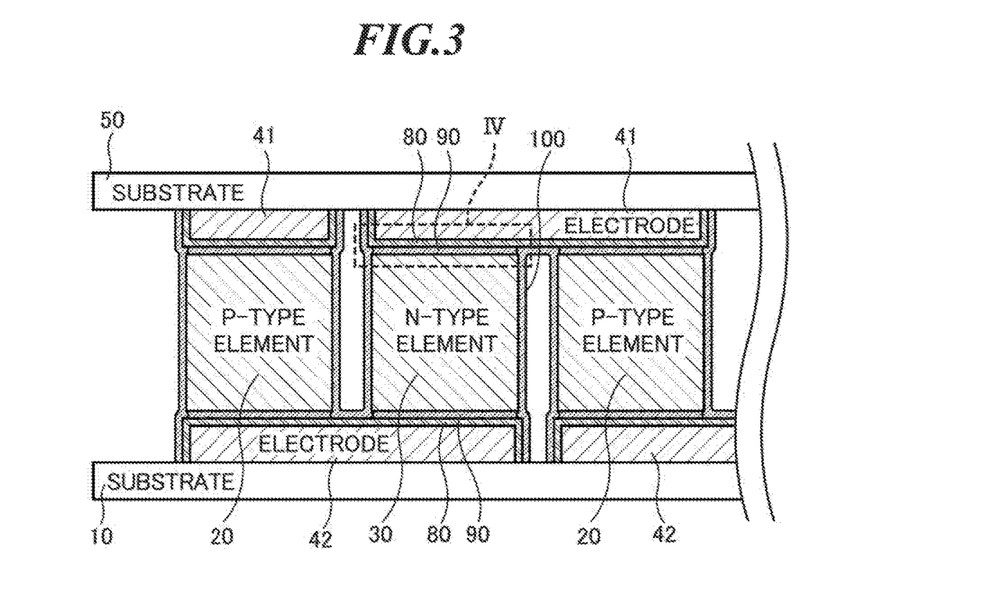
FIG. 3 is a partial cross section diagram showing an outline of a thermoelectric power module according to an embodiment of the present invention.

FIG. 3 is a partial cross section diagram showing an outline of a thermoelectric power module according to an embodiment of the present invention. As shown in FIG. 3, the thermoelectric power module 1 includes substrates 10 and 50, a P-type element 20, an N-type element 30, an electrode 41 at a higher temperature part, an electrode 42 at a lower temperature part, electrode protection layers 80, solder layers 90, and a coating film 100. In FIG. 3, barrier layers are omitted.

The electrode 41 at the higher temperature part and the electrode 42 at the lower temperature part are formed of, for example, copper (Cu) having a high electrical conduction property and high thermal conductivity. The electrode protection layers 80 are disposed at least on one principal surface (bottom surface in the drawing) of the electrode 41 at the higher temperature part and one principal surface (top surface in the drawing) of the electrode 42 at the lower temperature part. The electrode protection layers 80 may be also disposed on side surfaces of the electrode 41 at the higher temperature part and side surfaces of the electrode 42 at the lower temperature part. Further, the coating film 100 is formed in the thermoelectric power module 1 except for surfaces of the electrodes 41 and 42 which are in contact with the substrate or the heat exchanger, that is, a top surface of the electrode 41 at the higher temperature part and a bottom surface of the electrode 42 at the lower temperature part in the drawing.

Figure 4:
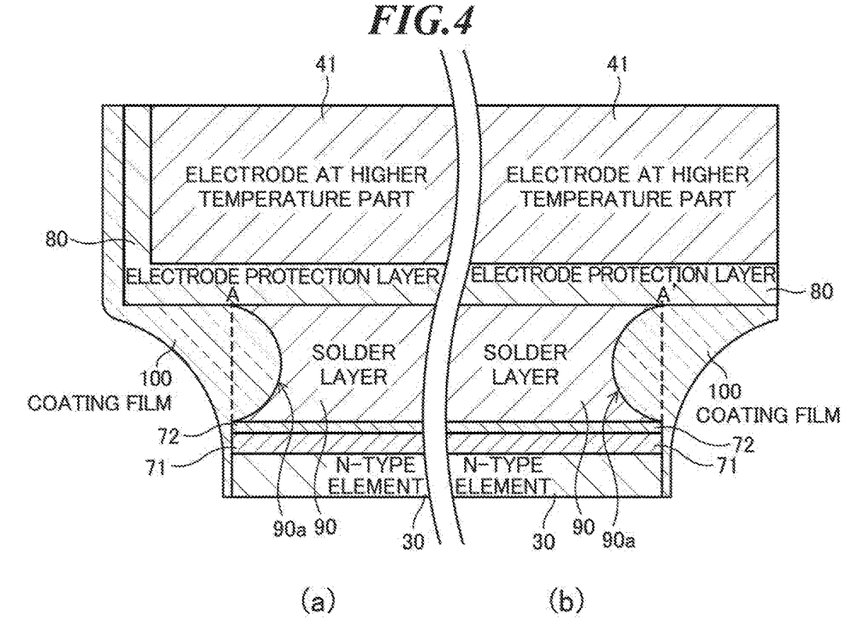
FIG. 4 is an enlarged cross section diagram showing a part of the thermoelectric power module as shown in FIG. 3.

FIG. 4 is an enlarged cross section diagram showing a part of the thermoelectric power module as shown in FIG. 3. FIG. 4(a) shows a cross section of the thermoelectric power module at a left portion of region IV as shown in FIG. 3, that is, an end portion of the electrode 41 at the higher temperature part. Further, FIG. 4(b) shows a cross section of the thermoelectric power module at a right portion of region IV as shown in FIG. 3, that is, a center portion of the electrode 41 at the higher temperature part.

Although FIG. 4 shows structure of a joint part of the N-type element 30 and the electrode 41 at the higher temperature part as an example, structure of a joint part of the P-type element 20 and the electrode 41 at the higher temperature part as shown in FIG. 3 is the same as the structure as shown in FIG. 4. Further, structure of a joint part of the N-type element 30 and the electrode 42 at the lower temperature part, and structure of a joint part of the P-type element 20 and the electrode 42 at the lower temperature part may be the same as the structure as shown in FIG. 4. However, a size of each part may be changed suitably.

As shown in FIG. 4, the thermoelectric power module includes the N-type element 30, at least one barrier layer (two barrier layers 71 and 72 are shown in FIG. 4), the electrode 41 at the higher temperature part, the electrode protection layer 80 disposed at least on one principal surface (bottom surface in the drawing) of the electrode 41 at the higher temperature part, and the solder layer 90 having a side surface formed with a recess 90a and joining a first region (A-A' as shown in FIG. 4) of the electrode protection layer 80 to the barrier layer 72.

In the present embodiment, the thermoelectric power module further includes the coating film 100. The coating film 100 is disposed on a side surface of the N-type element 30, side surfaces of the barrier layers 71 and 72, and the side surface of the solder layer 90. The coating film 100 covers a second region adjacent to the first region of the electrode protection layer 80, and is filled into the recess 90a of the solder layer 90.

As shown in FIG. 4(a), the electrode protection layer 80 may be disposed on not only one principal surface but also all side surfaces of the electrode 41 at the higher temperature part. In that case, the coating film 100 may cover the electrode protection layer 80 disposed on all side surfaces of the electrode 41 at the higher temperature part.

By providing the coating film 100 in this way, it is possible to effectively prevent oxidation of a joint layer (the barrier layer 71 to the electrode protection layer 80) for joining the thermoelectric element to the electrode. Further, since the coating film 100 is continuously provided from the thermoelectric element to the electrode to cover entire side surfaces of the thermoelectric power module, it is possible to prevent deterioration factors besides the oxidation of the joint layer, for example, a short circuit due to extraneous materials, dew condensation, and so on, to ensure reliability of the thermoelectric power module for a long time. Furthermore, since the coating film 100 is filled into the recess 90a of the solder layer 90, an area to be contact with the solder layer 90 is increased 1.3 times to 1.6 times in comparison with the case where the recess is not formed, and therefore, peeling off of the coating film 100 hardly occurs. On the other hand, a film thickness of the coating film is thin at the side surface of the thermoelectric element, and therefore, it is possible to suppress increase of heat-leakage between the heat exchanger at the higher temperature part and the heat exchanger at the lower temperature part.

In the case where two barrier layers 71 and 72 are provided as shown in FIG. 4, a thickness of the barrier layer 71 is substantially 7 μm, and a thickness of the barrier layer 72 is substantially 1 μm, for example. Further, a thickness of the electrode protection layer 80 is substantially 20 μm, a thickness of the solder layer 90 is substantially 50 μm to substantially 150 μm, and a depth of the recess 90a of the solder layer 90 is substantially 10 μm to substantially 100 μm.

Preferably, the barrier layer 71 is composed of a molybdenum (Mo) layer disposed on the thermoelectric element, and the barrier layer 72 is composed of a layer disposed on the molybdenum layer and including at least one of nickel (Ni), layered structure of tin/nickel (Sn/Ni), an alloy or intermetallic compound of nickel-tin (Ni—Sn), and combined structure of at least two thereof. As a material of the barrier layer 72, especially, the alloy or intermetallic compound of nickel-tin (Ni—Sn) is suitable.

By providing the barrier layer 72 of nickel, the nickel alloy, or the like, diffusion of solder contained in the solder layer 90 into the thermoelectric element is suppressed. Further, by providing the barrier layer 71 of molybdenum, diffusion of nickel contained in the barrier layer 72 or the electrode protection layer 80 into the thermoelectric element is suppressed. Furthermore, by providing the barrier layer 72 and the electrode protection layer 80, solder wettability can be improved.

Especially, in the case where the barrier layer 72 is composed of an intermetallic compound of nickel-tin rather than nickel, even if the thermoelectric power module is left in a high temperature environment for a long time, diffusion of nickel from the barrier layer 72 into the solder layer 90 is suppressed. This is because energy is required when the intermetallic compound of nickel-tin (Ni—Sn) forming the barrier layer 72 is decomposed into nickel (Ni) and tin (Sn), and more energy is required for nickel composing the intermetallic compound to diffuse into solder than that required for nickel simple substance to diffuse into solder.

When nickel has diffused from the barrier layer 72 into the solder layer 90, a part or the whole of the barrier layer 72 disappears, and joining due to a Ni—Mo alloy that existed at an interface between the barrier layer 72 and the barrier layer 71 is cut off. In the region where the barrier layer 72 disappears, an interface (Pb/Mo interface) between the solder layer 90 and the barrier layer 71 appears. However, lead (Pb) and molybdenum (Mo) do not form alloy, and therefore, resistance at the interface increases. Due to the increase of the resistance at the interface, there occurs a problem that output power of the thermoelectric power module lowers.

Therefore, by suppressing the diffusion of nickel from the barrier layer 72 into the solder layer 90, an interface (Pb/Mo interface) between the solder layer 90 and the barrier layer 71 does not appear, increase of the resistance of the interface is suppressed, and lowering of output power of the thermoelectric power module due to increase of the resistance value hardly occurs. As a result, it is possible to provide a thermoelectric power module capable of withstanding long time use in a high temperature environment where a temperature of a higher temperature part becomes 250° C. to 280° C. at maximum.

Further, by adjusting a material of the barrier layer 72 and the composition of solder in the solder layer 90, it is possible to control the solder wettability at surfaces of the barrier layer 72 to form the recess 90a having a desirable depth at the side surface of the solder layer 90. In the present embodiment, solder in the solder layer 90 contains lead (Pb) at 85% or more. In this case, a melting point of solder becomes 260° C. or higher, and thereby, solder does not melt at a high temperature of 260° C. and can favorably join the thermoelectric element to the electrode. Further, in the case where a content rate of lead is 90% or more, a melting point of solder becomes 275° C. or higher. In the case where a content rate of lead is 95% or more, a melting point of solder becomes 305° C. or higher. In the case where a content rate of lead is 98% or more, a melting point of solder becomes 317° C. or higher.

Figure 5:
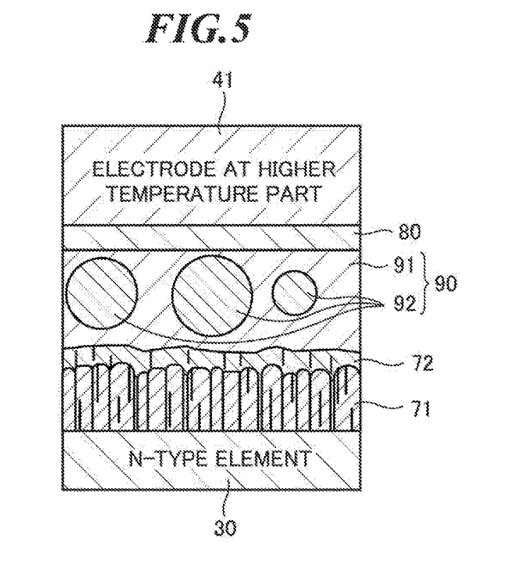
FIG. 5 is a detailed cross section diagram showing the structure surrounding the solder layer in FIG. 4.

FIG. 5 is a detailed cross section diagram showing the structure surrounding the solder layer in FIG. 4. As shown in FIG. 5, the solder layer 90 may include a solder substrate 91 and particles 92. By mixing the particles 92 into solder in the joint layer for joining the thermoelectric element to the electrode, the particles 92 function as clearance retaining members. Accordingly, even in the case where many thermoelectric elements and electrodes are joined to one another simultaneously, heights of the thermoelectric power module become uniform, and sufficient joining strength can be ensured. Also, in solder joining under the condition where pressure acts or in use under a high temperature environment, a thickness of the solder layer 90 is kept by the particles 92. Accordingly, solder can be prevented from jutting out, and it is possible to prevent destruction or the like due to reaction of jutting out solder and a thermoelectric material.

As the particles 92, for example, copper (Cu) balls can be employed. In the case where copper is employed as a material of the particles 92, the particles 92 do not malt and disappear at a high temperature of 260° C. to 317° C., and since the electric resistance is low, an electric current can efficiently flow between the thermoelectric element and the electrode. Further, nickel (Ni) or gold (Au) may be coated on surfaces of the copper balls.

A diameter of the copper ball is suitably 5 μm to 100 μm. In the case where the diameter of the copper ball is less than 5 μm, when pressure is applied to the thermoelectric power module under a high temperature environment of 200° C. or higher, a thickness of the solder layer 90 becomes less than 5 μm, which is too thin and causes junction defect. On the other hand, in the case where the diameter of the copper ball is larger than 100 μm, a thickness of the solder layer 90 becomes thick, which increases electric resistance of the interface and causes remarkable power loss.

Incidentally, in the case where the thermoelectric power module having the full-skeleton structure is adhered closely to the heat exchangers by using grease having thermal conductivity, thermal resistance becomes high when the pressure applied perpendicularly between the thermoelectric power module and the heat exchangers is less than 196 kN/m$^2$ (2 kgf/cm$^2$), and therefore, it is desirable that they are used while applying pressure of 196 kN/m (2 kgf/cm$^2$) or more perpendicularly.

Since a weight ratio of the copper balls which can bear the pressure of 196 kN/m$^2$ (2 kgf/cm$^2$) is required to be 0.75 wt % or more, the lower limit of the weight ratio of the copper balls is 0.75 wt %. If the weight ratio of the copper balls is less than 0.75 wt %, the load affecting the copper balls becomes large, and the copper balls may be crushed or cracks may occur in the thermoelectric element from the copper balls as starting points.

Further, when the pressure applied perpendicularly between the thermoelectric power module and the heat exchangers is 1960 kN/m$^2$ (20 kgf/cm$^2$), in the case where the weight ratio of the copper balls is 7.5 wt %, the thermoelectric element does not change the shape, and therefore, the weight ratio of the copper balls is more desirably 7.5 wt % or more.

On the other hand, a success rate of soldered joints with regards to the weight ratio of the copper balls is measured. In the case where the weight ratio of the copper balls is 50 wt %, the success rate is about 100%, and in the case where the weight ratio of the copper balls is 75 wt %, the success rate is about 93%. Accordingly, it is desirable that the copper balls are mixed into the solder substrate 91 such that the weight ratio of the copper balls is 0.75 wt % to 75 wt %, more preferably 7.5 wt % to 50 wt %.

Figure 6:
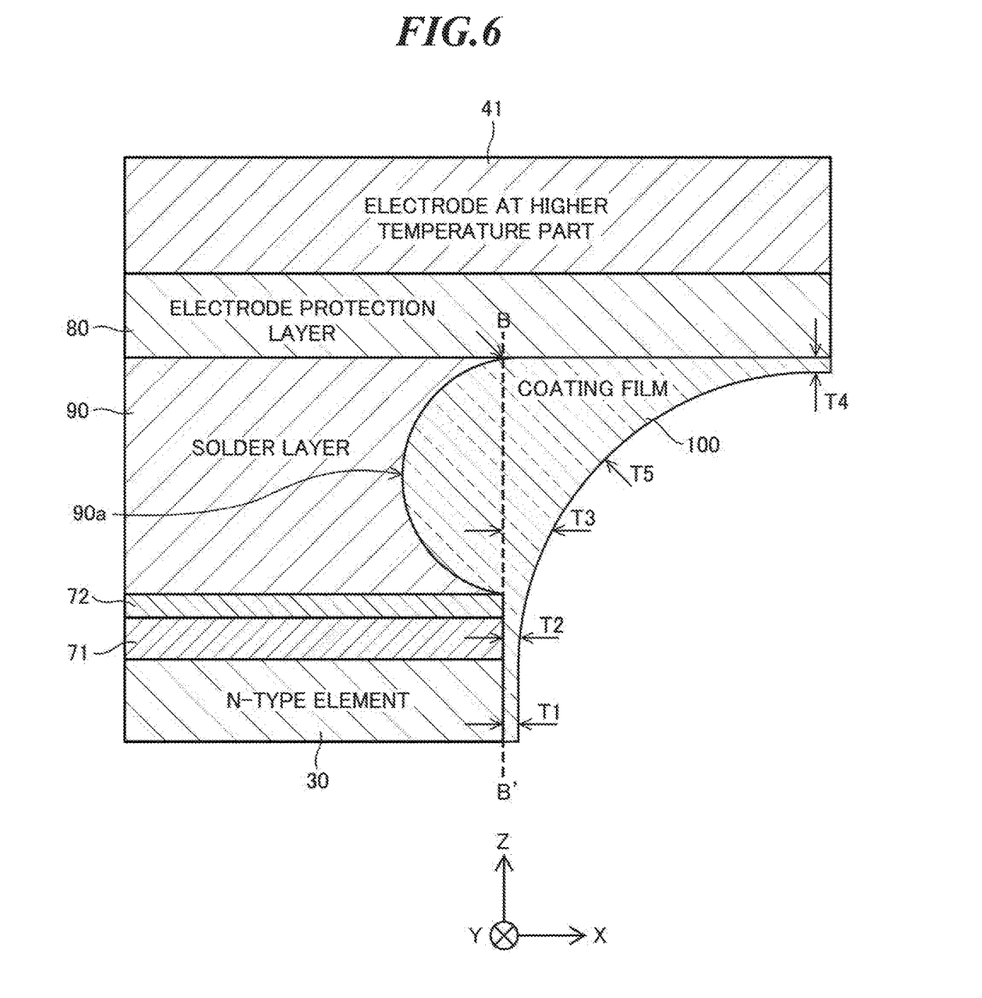
FIG. 6 is a detailed cross section diagram showing the structure surrounding the coating film in FIG. 4.

FIG. 6 is a detailed cross section diagram showing the structure surrounding the coating film in FIG. 4. In FIG. 6, X-axis direction, Y-axis direction, and Z-axis direction represent a length direction, a width direction, and a height direction of the thermoelectric element (N-type element 30 in FIG. 6). The coating film 100 has a film thickness T1 at the side surface of the N-type element 30, a film thickness T2 at the side surface of the at least one barrier layer 71 or 72, and a film thickness T3 at the side surface of the solder layer 90, when measured from a plane B-B' (YZ plane) passing along the side surface of the N-type element 30 and in a direction (X-axis direction) orthogonal to the plane B-B'. Here, the film thicknesses T1-T3 have the relationship T1<T2<T3.

As shown in FIG. 6, a film thickness of the coating film 100 in the X-axis direction may be continuously varied in a region at least from an interface between the N-type element and the barrier layer 71 to a portion of the side surface of the solder layer 90. Also, a film thickness of the coating film 100 in the Y-axis direction has the similar size relation to that in the X-axis direction, and may be continuously varied in a region at least from an interface between the N-type element 30 and the barrier layer 71 to a portion of the side surface of the solder layer 90.

Here, in order to effectively prevent infiltration of oxygen from the interface of the N-type element 30 and the barrier layer 71, it is desirable that the film thickness T1 of the coating film 100 at the side surface of the N-type element 30 is 3 µm or more. Further, in order to effectively prevent oxidation of the electrode protection layer 80, it is desirable that the film thickness T4 of the coating film 100 in a direction (Z-axis direction) orthogonal to a principal surface of the electrode protection layer 80 is also 3 µm or more.

Accordingly, a minimum value of a film thickness T5 of the coating film 100, when measured from a straight line on which the plane B-B' and the principal surface of the electrode protection layer 80 intersect with each other, is $(3^2+3^2)^{0.5}=4.2$ µm. Further, in order to continuously increase the film thickness of the coating film 100 along Z-axis direction to heighten the oxidation preventing effect, it is desirable that the film thickness T5 is 10 µm or more. On the other hand, in order not to increase thermal leakage via the coating film 100, it is desirable that each of the film thicknesses T1 and T4 is 20 µm or less and the film thickness T5 is 100 µm or less. Thereby, it is also possible to suppress an amount of consumption of a coating agent to be used.

Since the coating film 100 is also filled into the recess 90a of the solder layer 90, taking the film thickness of that portion into consideration, the film thickness of the coating film 100 at the side surface of the solder layer 90 is still larger. Thereby, it is possible to effectively prevent the infiltration of oxygen into the solder layer 90, the barrier layer 71 or 72, or the electrode protection layer 80. Further, since the recess 90a is formed at the side surface of the solder layer 90, an area of the coating film 100 to be contact with the solder layer 90 is increased 1.3 times to 1.6 times, and therefore, peeling off of the coating film 100 from the solder layer 90 hardly occurs.

As selection criteria of a material of the coating film 100, the following items are mentioned.

Firstly, it is desirable that the material of the coating film 100 has a high heat-resisting property. Since the thermoelectric power module employing a bismuth-tellurium (Bi—Te) based thermoelectric material is used in a temperature environment where a temperature at a higher temperature part becomes 250° C. to 280° C. at maximum, it is desirable that the material of the coating film 100 has a heat resistance temperature of 280° C. or higher.

Next, it is desirable that the material of the coating film 100 has few film defects. Since a coloring agent becomes a factor of the defect, a transparent coating material is desirable. Further, it is desirable that the material of the coating film 100 has a satisfactory adhesive property. On that account, it is desirable that the material of the coating film 100 can be handled with a dipping method or an electrodeposition method. Furthermore, it is to be desired for the material of the coating film 100 that a baking temperature (also called "sintering temperature" in the present application) is low. In order not to melt solder of the solder layer 90, it is desirable that the baking temperature is equal to or lower than a melting point of solder, preferably equal to or lower than 200° C.

Specifically, as the material of the coating film 100, for example, heat-resistant resin such as modified silicone, polyimide, or imide-amide can be employed. The heat resistance temperature of modified silicone is 300° C. or higher. As a coating method thereof, the dipping method can be used. The sintering temperature thereof is substantially 200° C. The heat resistance temperature of polyimide is 300° C. or higher. As a coating method thereof, the dipping method can be used. The sintering temperature thereof is substantially 200° C. The heat resistance temperature of imide-amide is 250° C. or higher. As a coating method thereof, the electrodeposition method can be used. The sintering temperature thereof is substantially 230° C. Among the above-mentioned materials, according to a result of a heating test in the air, it is validated that an effect in the case of employing modified silicone is remarkable.

Figure 7:
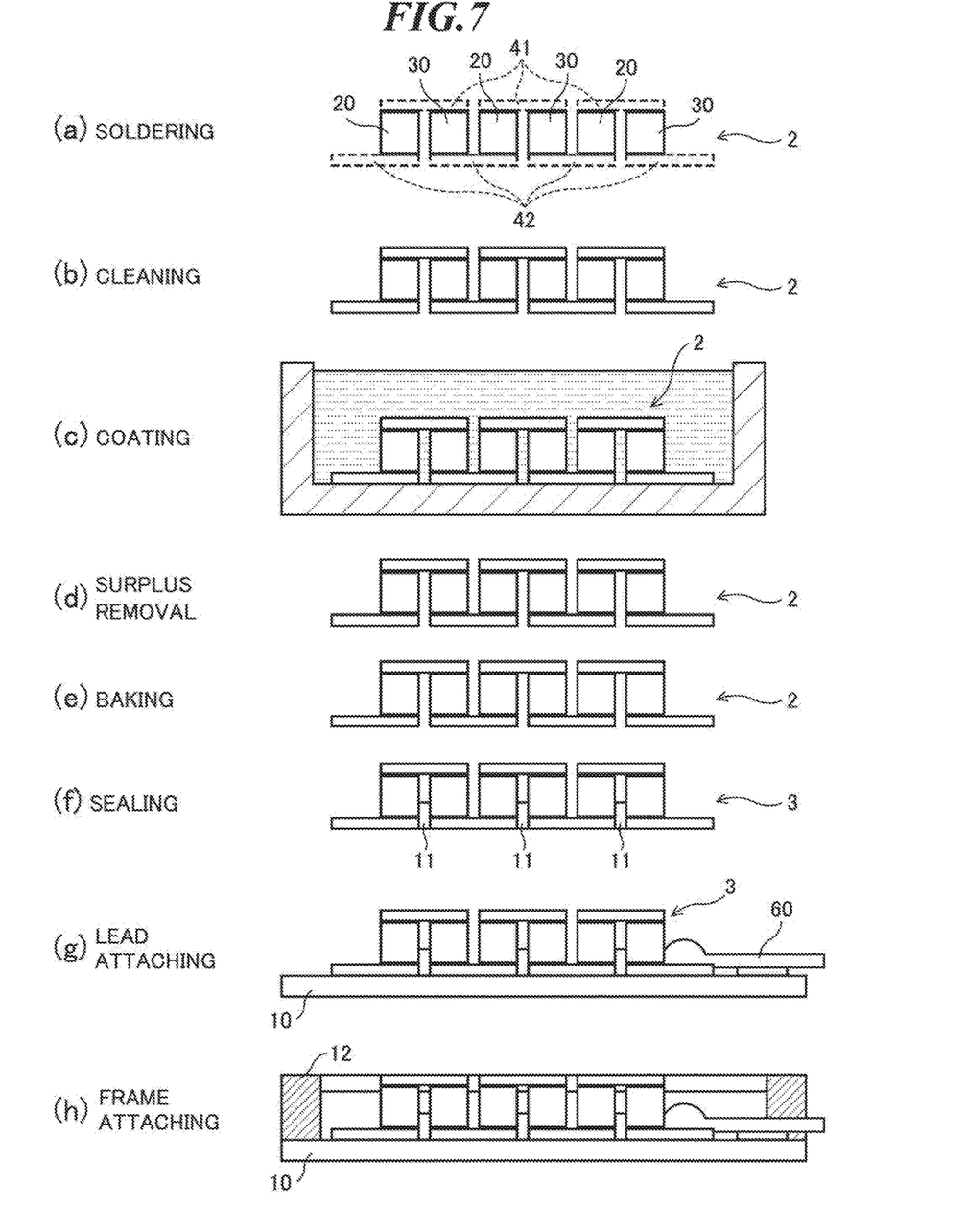
FIG. 7 is a diagram showing an example of a method of manufacturing a thermoelectric power module according to an embodiment of the present invention.

Next, an example of a method of manufacturing a thermoelectric power module according to an embodiment of the present invention will be explained referring to FIGS. 3, 4 and 7. FIG. 7 is a diagram showing an example of a method of manufacturing a thermoelectric power module according to an embodiment of the present invention.

Firstly, preprocessing is carried out according to need for P-type thermoelectric materials and N-type thermoelectric materials which have been molded into predetermined shapes in advance. As the preprocessing, for example, in order to clean surfaces of the thermoelectric materials, reverse sputtering is carried out in the atmosphere of argon (Ar) gas. The reverse sputtering is a sort of dry etching, and by sputtering argon ions to the surfaces of the thermoelectric materials, oxide films formed on the surfaces of the thermoelectric materials, contamination, and so on are removed. In that way, the P-type elements 20 and the N-type elements 30 as shown in FIG. 3 are prepared.

Next, PVD (physical vapor deposition) such as an ion plating method is carried out by employing molybdenum (Mo), and thereby, the barrier layers 71 (See FIG. 4) are formed on top surfaces and bottom surfaces of the P-type elements and the N-type elements 30. The ion plating method is a method of forming a film by activating a portion of evaporation particles into ions or exiting particles by utilizing plasma (gas plasma). Further, PVD such as the ion plating method is carried out by employing an alloy or intermetallic compound of nickel-tin (Ni—Sn), and thereby, the barrier layers 72 (See FIG. 4) are formed on the barrier layers 71.

On the other hand, a film, such as plating, including at least one of, for example, nickel (Ni), layered structure of gold/nickel (Au/Ni), tin (Sn), an alloy or intermetallic compound or the like containing nickel (Ni), and combined structure of at least two thereof is formed on one principal surface (bottom surface in FIG. 3) and side surfaces of the electrode 41 formed of copper (Cu) at the higher temperature part, and thereby, the electrode protection layer 80 is formed. Further, a film, such as plating, including at least one of, for example, nickel (Ni), layered structure of gold/nickel (Au/Ni), tin (Sn), an alloy or intermetallic compound or the like containing nickel (Ni), and combined structure of at least two thereof is formed on one principal surface (top surface in FIG. 3) and side surfaces of the electrode 42 formed of copper (Cu) at the lower temperature part, and thereby, the electrode protection layer 80 is formed.

At a soldering process as shown in FIG. 7(a), the electrodes 41 at the higher temperature part and the electrodes 42 at the lower temperature part are attached to the P-type elements 20 and the N-type elements 30 by soldering. That is, the barrier layers 72 formed on the P-type elements 20 and the N-type elements 30 are joined to the electrode protection layers 80 formed on the electrodes 41 at the higher temperature part and the electrodes 42 at the lower temperature part by employing solder containing lead (Pb) at 85% or more. Thereby, a workpiece 2 of the thermoelectric power module, in which the P-type elements 20 and the N-type elements 30 are serially connected via the electrodes 41 at the higher temperature part and the electrodes 42 at the lower temperature part, is produced.

At a cleaning process as shown in FIG. 7(b), oxide films, contamination, and so on adhered to surfaces of the workpiece 2 of the thermoelectric power module are cleaned off. Further, at a coating process as shown in FIG. 7(c), coating is carried out on the workpiece 2 of the thermoelectric power module by immersing the workpiece 2 of the thermoelectric power module in liquid coating such as modified silicone filled up in a vessel. Here, according to viscosity of the liquid coating, a shape of the coating film 100 as shown in FIG. 4 can be controlled.

At a surplus removal step as shown in FIG. 7(d), surplus liquid coating adhered to the workpiece 2 of the thermoelectric power module is removed. Especially, the liquid coating adhered to the other principal surface (top surface in the drawing) of the electrodes 41 at the higher temperature part and the other principal surface (bottom surface in the drawing) of the electrodes 42 at the lower temperature part is removed by using thinner or the like, and thereby, a drop of the thermal conductivity is prevented when these surfaces are in contact with the substrates or the heat exchangers.

At a baking process as shown in FIG. 7(e), the workpiece 2 of the thermoelectric power module is put into a furnace having an internal temperature of, for example, substantially 200° C., and thereby, the liquid coating applied on the workpiece 2 of the thermoelectric power module is baked. Thus, the coating film 100 as shown in FIG. 4 is formed. Further, at a sealing process as shown in FIG. 7(f), sealing materials 11 may be inserted between the plural electrodes 42 at the lower temperature part. Thereby, a workpiece 3 of the thermoelectric power module having an improved mechanical strength is completed.

At a lead attaching process as shown in FIG. 7(g), the workpiece 3 of the thermoelectric power module is mounted on the substrate 10, and two lead wires 60 are connected to the electrode at the lower temperature part, which is electrically connected to a P-type element at one end of a serial circuit composed of plural PN element pairs, and the electrode at the lower temperature part, which is electrically connected to an N-type element at the other end of the serial circuit, respectively. Further, at a frame attaching process as shown in FIG. 7(h), a frame 12 is attached to the substrate 10, and then, a thermoelectric power module having a half-skeleton structure is completed.

Figure 8:
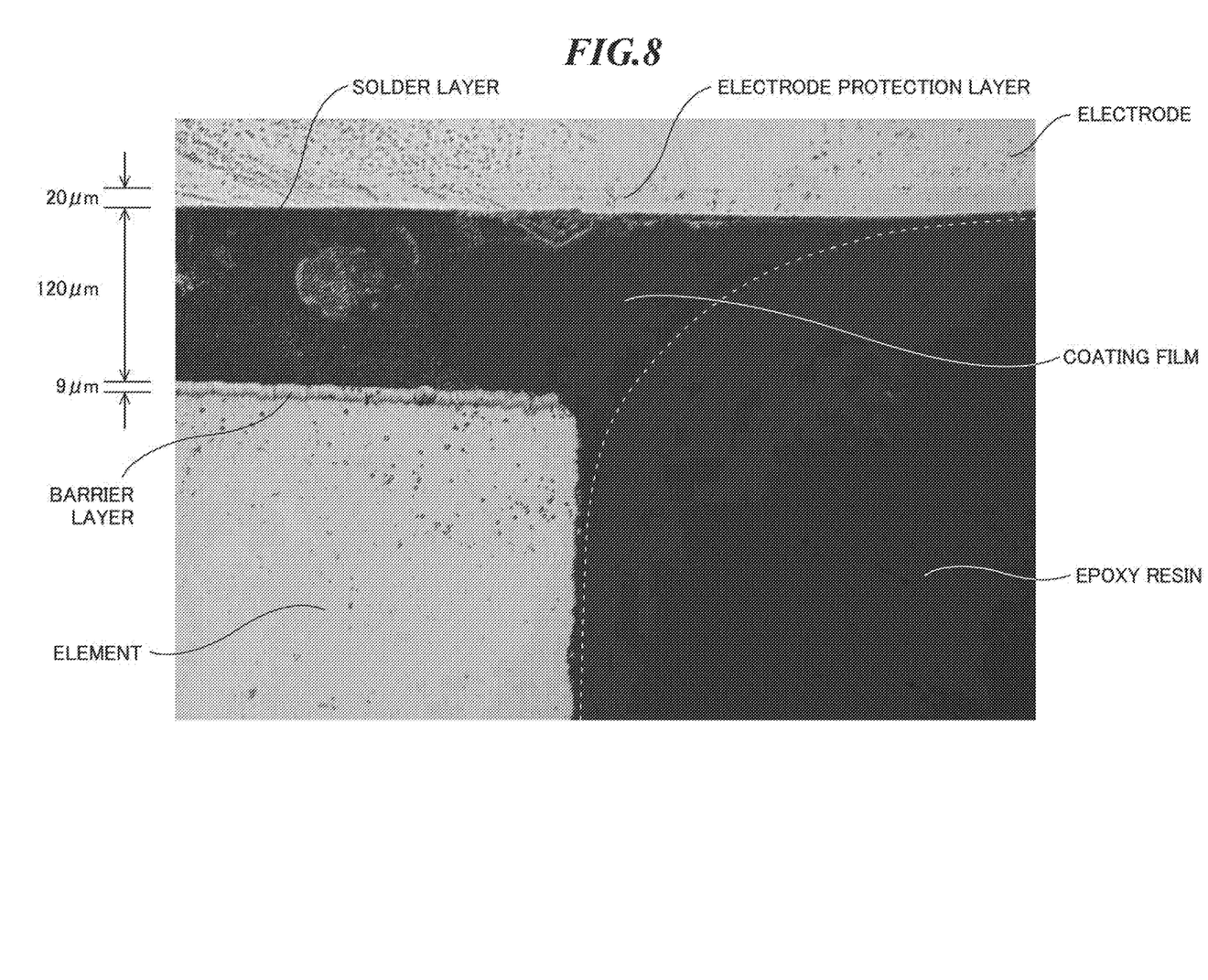
FIG. 8 shows a photomicrograph of a cross section of an actually manufactured thermoelectric power module.

FIG. 8 shows a photomicrograph of a cross section of an actually manufactured thermoelectric power module. In order to conduct cross-sectional observation, a treatment of wrapping the whole thermoelectric power module in epoxy resin has been carried out. On that account, in FIG. 8, the epoxy resin is filled up into a space at a right side of the thermoelectric element and an interface between the coating film and the epoxy resin is unclear, and therefore, a white broken line is added.

As shown in FIG. 8, the recess is formed at the side surface of the solder layer, and the coating film is filled into the recess of the solder layer. Further, the coating film is formed with respective predetermined film thicknesses at the side surfaces of the thermoelectric element to the solder layer. Here, a thickness of the electrode protection layer is substantially 20 μm, a thickness of the solder layer is substantially 120 μm, and a thickness of the barrier layers (barrier layers 71 and 72 as shown in FIG. 6) is substantially 9 μm.

Next, a result of an endurance test will be explained.

Figure 9:
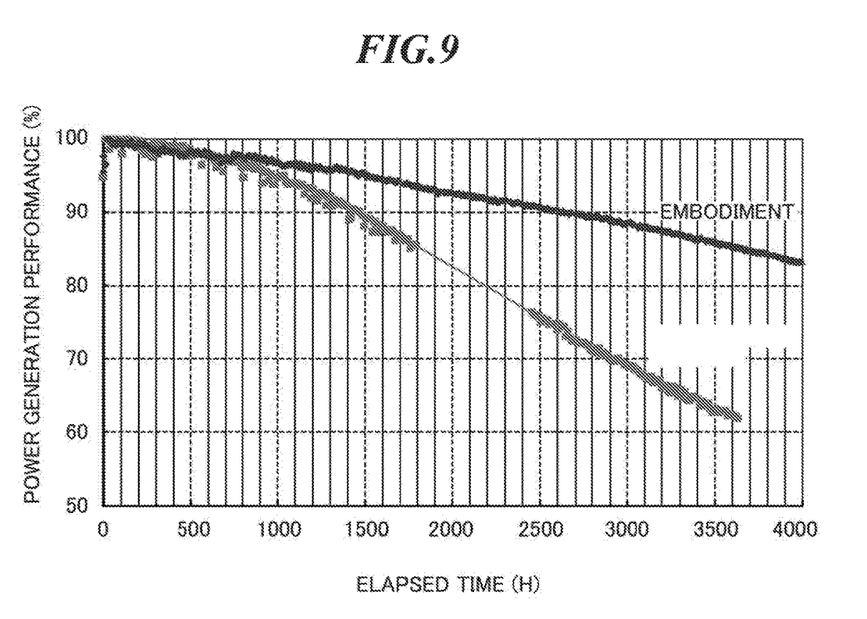
FIG. 9 is a diagram showing transitions of power generation performance, that occur over elapsed time, of a thermoelectric power module according to an embodiment of the present invention and a thermoelectric power module according to a comparative example.

FIG. 9 is a diagram showing transitions of power generation performance, that occur over elapsed time, of a thermoelectric power module according to an embodiment of the present invention and a thermoelectric power module according to a comparative example. The horizontal axis in FIG. 9 represents elapsed time (H), and the vertical axis in FIG. 9 represents a ratio (%) of power generation performance to the initial characteristic.

The thermoelectric power module according to the embodiment is manufactured by immersing a workpiece of the thermoelectric power module having a half-skeleton structure in thinner to degrease, applying a clear coating agent of a modified silicone type on surfaces thereof according to a dipping method, and baking it for one hour in the air at 200° C. As the coating agent, SPcoat SPSG-clear KK (prototype) made by CERAMIC COAT CO., LTD. is used. On the other hand, no coating is applied on the thermoelectric power module according to the comparative example.

In the endurance test, the thermoelectric power module is interposed between a heater and a water cooled plate, the higher temperature part is kept at 280° C. and the lower temperature part is kept at 30° C., and transitions of output power of the thermoelectric power modules are observed. At the time when 3500 hours have been elapsed from a start of the endurance test, a power decline of the thermoelectric power module according to the embodiment is about 14% and a power decline of the thermoelectric power module according to the comparative example is about 37%, and thus, a difference therebetween is about 23%. Accordingly, by providing the coating film, a power decline of the thermoelectric power module is improved by about 60% (23÷37=0.62).

Figure 10:
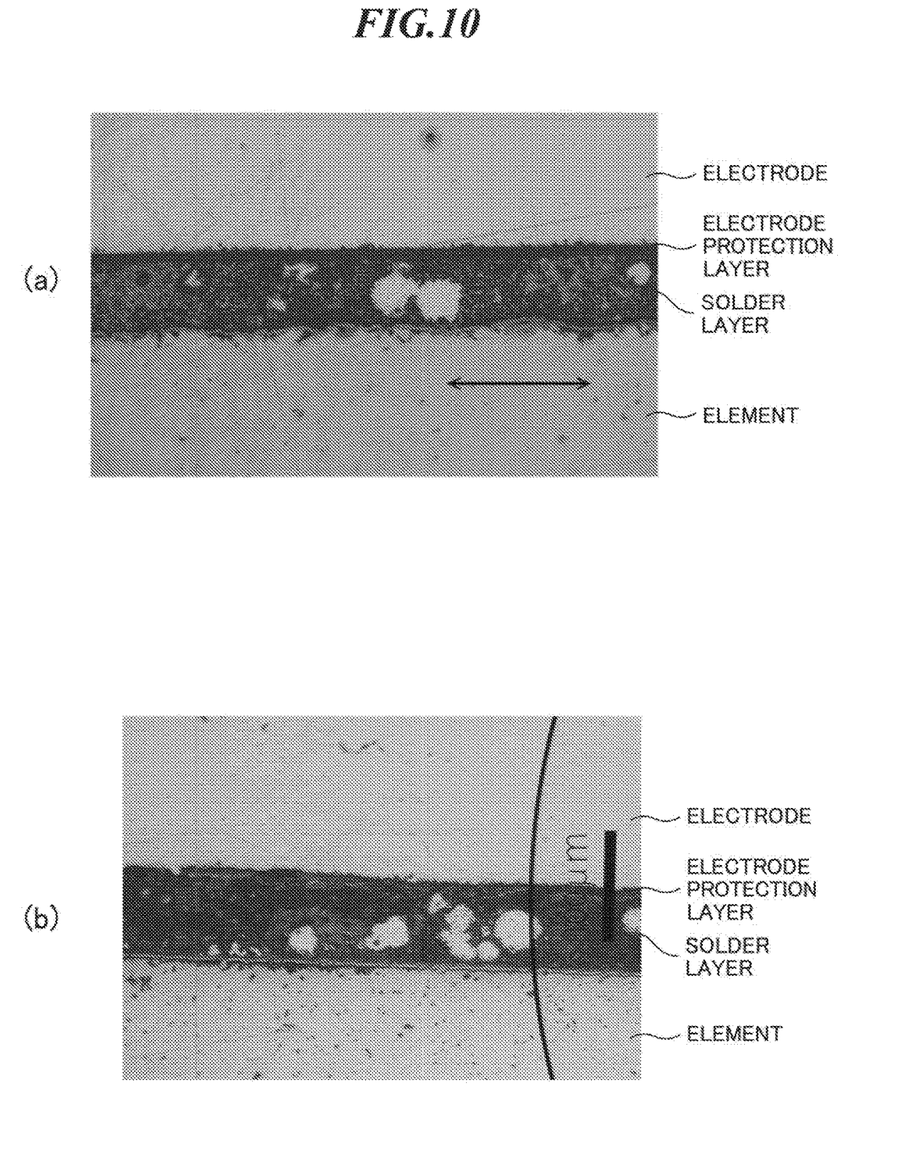
FIG. 10 shows photomicrographs of cross sections of a thermoelectric power module according to a comparative example and a thermoelectric power module according to an embodiment of the present invention after an endurance test.

FIG. 10 shows photomicrographs of cross sections of a thermoelectric power module according to a comparative example and a thermoelectric power module according to an embodiment of the present invention after the endurance test. FIG. 10(a) shows a cross section of the thermoelectric power module according to the comparative example at the time when 3650 hours have been elapsed from the start of the endurance test. In the comparative example, nickel employed as the electrode protection layer 80 has been oxidized to be black, and nickel oxide has been diffused into the solder layer 90. The particles within the solder layer 90 are copper balls.

FIG. 10(b) shows a cross section of the thermoelectric power module according to the embodiment at the time when 5000 hours have been elapsed from the start of the endurance test. In the embodiment, oxidation of nickel employed as the electrode protection layer 80 is suppressed, and deterioration of the solder layer 90 is not observed. Thus, it is understood that an excellent effect of preventing oxidation can be obtained by providing the coating film.

The present invention is not limited to the above-explained embodiment but many modifications are possible within the technical idea of the present invention by one of ordinary skill in the art.

INDUSTRIAL APPLICABILITY

The present invention can be applied to a thermoelectric power module using thermoelectric elements and thereby generating electricity by utilizing difference in temperature.

The invention claimed is:

1. A thermoelectric power module comprising:
a thermoelectric element employing a bismuth-tellurium (Bi—Te) based thermoelectric material;
at least one barrier layer deposited on the thermoelectric element;
an electrode;
an electrode protection layer deposited at least on one principal surface of the electrode;
a solder layer having a side surface formed with a recess, wherein the solder layer joins a first region of the electrode protection layer to the at least one barrier layer; and
a coating film continuously deposited on a side surface of the thermoelectric element, a side surface of the at least one barrier layer, and the side surface of the solder layer, wherein the coating film covers a second region adjacent to the first region of the electrode protection layer and is filled into the recess of the solder layer, and a film thickness of the coating film at the side surface of the thermoelectric element is thinner than a thickness of the solder layer,
wherein the film thickness of the coating film at the side surface of the thermoelectric element is within a first range from 3 µm to 20 µm, a film thickness of the coating film at the side surface of the at least one barrier layer is within a second range and larger than the film thickness within the first range, and a film thickness of the coating film at the side surface of the solder layer is within a third range and larger than the film thickness within the second range, when measured from a plane passing along the side surface of the thermoelectric element and in a direction orthogonal to the plane.

2. The thermoelectric power module according to claim 1, wherein the solder layer comprises a solder comprising lead (Pb) at not less than 85%.

3. The thermoelectric power module according to claim 1, wherein the coating film comprises a material selected from the group consisting of modified silicone, polyimide, and imide-amide.

4. The thermoelectric power module according to claim 1, wherein the at least one barrier layer comprises a molybdenum (Mo) layer deposited on the thermoelectric element, and a layer deposited on the molybdenum layer comprising at least one material selected from the group consisting of nickel (Ni), a layered structure of tin/nickel (Sn/Ni), an alloy or intermetallic compound of nickel-tin (Ni—Sn), and a combined structure of at least two thereof.

5. The thermoelectric power module according to claim 1, wherein the electrode protection layer comprises at least one metal layer.

6. The thermoelectric power module according to claim 5, wherein the electrode protection layer comprises at least one material selected from the group consisting of nickel (Ni), a layered structure of gold/nickel (Au/Ni), tin (Sn), an alloy or intermetallic compound containing nickel (Ni), and a combined structure of at least two thereof.

7. The thermoelectric power module according to claim 2, wherein the coating film comprises a material selected from the group consisting of modified silicone, polyimide, and imide-amide.

8. The thermoelectric power module according to claim 2, wherein the at least one barrier layer comprises a molybdenum (Mo) layer deposited on the thermoelectric element, and a layer deposited on the molybdenum layer and comprising at least one material selected from the group consisting of nickel (Ni), a layered structure of tin/nickel (Sn/Ni), an alloy or intermetallic compound of nickel-tin (Ni—Sn), and a combined structure of at least two thereof.

9. The thermoelectric power module according to claim 3, wherein the at least one barrier layer comprises a molybdenum (Mo) layer deposited on the thermoelectric element, and a layer deposited on the molybdenum layer and comprising at least one material selected from the group consisting of nickel (Ni), a layered structure of tin/nickel (Sn/Ni), an alloy or intermetallic compound of nickel-tin (Ni—Sn), and a combined structure of at least two thereof.

10. The thermoelectric power module according to claim 7, wherein the at least one barrier layer comprises a molybdenum (Mo) layer deposited on the thermoelectric element, and a layer deposited on the molybdenum layer and comprising at least one material selected from the group consisting of nickel (Ni), a layered structure of tin/nickel (Sn/Ni), an alloy or intermetallic compound of nickel-tin (Ni—Sn), and a combined structure of at least two thereof.

11. The thermoelectric power module according to claim 2, wherein the electrode protection layer comprises at least one metal layer.

* * * * *